(12) United States Patent
Fischer et al.

(10) Patent No.: US 7,535,716 B2
(45) Date of Patent: May 19, 2009

(54) APPARATUS FOR ENCLOSING ELECTRONIC COMPONENTS USED IN TELECOMMUNICATION SYSTEMS

(75) Inventors: Larry G. Fischer, Waseca, MN (US);
Eric S. Moreau, St. Peter, MN (US);
Gregory Martell, Chanhassen, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 11/752,364

(22) Filed: May 23, 2007

(65) Prior Publication Data

US 2008/0291627 A1 Nov. 27, 2008

(51) Int. Cl.
*H05K 7/20* (2006.01)

(52) U.S. Cl. ............... 361/714; 361/679; 361/688; 165/80.3; 174/50.54; 174/50

(58) Field of Classification Search ........... 361/679, 361/686, 687–697, 704–712, 714–717; 165/80.1, 165/80.2, 80.3, 104.33, 181, 185; 174/16.1, 174/16.3, 70 S, 47, 52.1; 138/108; 45/601; D13/152, 137, 184; D14/238, 240; 248/61
See application file for complete search history.

(56) References Cited

U.S. PATENT DOCUMENTS

| | | | | |
|---|---|---|---|---|
| 3,359,460 | A | * | 12/1967 | Ragone et al. ............ 361/679 |
| 3,717,813 | A | * | 2/1973 | Lieberman et al. .......... 725/149 |
| 3,876,926 | A | * | 4/1975 | Schott et al. .............. 322/28 |
| 4,656,559 | A | | 4/1987 | Fathi |
| 5,065,278 | A | * | 11/1991 | Schultz .................... 361/688 |
| 5,089,935 | A | | 2/1992 | Ito |
| 5,150,278 | A | * | 9/1992 | Lynes et al. ............... 361/690 |
| 5,181,680 | A | * | 1/1993 | Coll ......................... 248/61 |
| D336,074 | S | * | 6/1993 | Friend et al. ............. D13/184 |
| 5,267,122 | A | | 11/1993 | Glover et al. |

(Continued)

FOREIGN PATENT DOCUMENTS

DE 202005014485 U1 * 2/2006

(Continued)

OTHER PUBLICATIONS

Fox et al., "Star-Structure Optical Local Networks", "British Telecommunications Technology Journal", Apr. 1989, pp. 76-88, vol. 7, No. 2, Publisher: Fulcrum.

*Primary Examiner*—Michael V Datskovskiy
(74) *Attorney, Agent, or Firm*—Fogg & Powers LLC

(57) ABSTRACT

An apparatus for enclosing electronic components such as used in telecommunication systems is disclosed. The apparatus includes a housing defining a chamber, with the housing comprising a front wall having an outer surface and a length dimension greater than a width dimension. A pair of opposing side walls are each contiguous with the front wall, and a pair of opposing end walls are each contiguous with the side walls and the front wall. A plurality of non-removable heat transfer fins are an integral part of the outer surface of the front wall. The fins are positioned at an angle with respect to the length dimension of the front wall, with each of the fins having a continuous uninterrupted structure across the outer surface between the opposing side walls. A removable back cover opposite the front wall is configured to seal the chamber of the housing.

29 Claims, 9 Drawing Sheets

U.S. PATENT DOCUMENTS

| | | | |
|---|---|---|---|
| 5,513,071 A * | 4/1996 | LaViolette et al. | 361/703 |
| D379,088 S * | 5/1997 | Hopper | D13/152 |
| D395,897 S * | 7/1998 | Honma et al. | D14/240 |
| 5,842,514 A | 12/1998 | Zapach et al. | |
| 5,898,412 A * | 4/1999 | Jones et al. | 343/872 |
| D410,652 S * | 6/1999 | Jones et al. | D14/238 |
| D416,873 S * | 11/1999 | Korsunsky et al. | D13/184 |
| 6,038,129 A * | 3/2000 | Falaki et al. | 361/699 |
| D422,999 S * | 4/2000 | Overton et al. | D14/137 |
| D424,554 S * | 5/2000 | Overton et al. | D14/137 |
| 6,065,530 A * | 5/2000 | Austin et al. | 165/80.3 |
| 6,085,769 A * | 7/2000 | Poyner et al. | 137/2 |
| 6,104,611 A | 8/2000 | Glover et al. | |
| 6,118,662 A * | 9/2000 | Hutchison et al. | 361/704 |
| 6,354,461 B1 * | 3/2002 | Tenney et al. | 220/836 |
| D458,228 S * | 6/2002 | Jacobson | D13/152 |
| D462,675 S | 9/2002 | Kusz et al. | |
| 6,510,223 B2 | 1/2003 | Laetsch | |
| 6,563,050 B2 | 5/2003 | Gustine et al. | |
| 6,587,339 B1 | 7/2003 | Daniels et al. | |
| 6,628,521 B2 | 9/2003 | Gustine et al. | |
| 6,781,830 B2 | 8/2004 | Barth et al. | |
| 6,862,180 B2 | 3/2005 | Sawyer et al. | |
| 6,865,085 B1 | 3/2005 | Ferris et al. | |
| 6,894,907 B2 | 5/2005 | Gustine et al. | |
| 6,897,377 B2 | 5/2005 | Gustine et al. | |
| 6,992,249 B2 | 1/2006 | Gustine et al. | |
| 7,013,074 B2 * | 3/2006 | Battey et al. | 385/135 |
| 7,075,789 B2 | 7/2006 | Gustine et al. | |
| 7,118,697 B2 | 10/2006 | Sawyer et al. | |
| 2005/0170681 A1 | 8/2005 | Gustine et al. | |
| 2007/0230137 A1 * | 10/2007 | Inagaki | 361/719 |
| 2008/0137296 A1 * | 6/2008 | DuQuette et al. | 361/695 |

FOREIGN PATENT DOCUMENTS

JP 01253997 A * 10/1989

* cited by examiner

US 7,535,716 B2

APPARATUS FOR ENCLOSING ELECTRONIC COMPONENTS USED IN TELECOMMUNICATION SYSTEMS

BACKGROUND

Environmentally protected housings are used in a wide variety of applications, including containing and protecting electronic components of the type used for transferring signals over long distances. For example, the telecommunications industry transfers signals over optical fibers. If the signal is transferred over a long distance, the signal may be too weak by the time it reaches its destination to be useful. Consequently, electronic circuit cards are used to detect, clean up, and amplify a weak signal for retransmission through another length of fiber-optic cable. These electronic circuit cards are often deployed in environmentally protected housings located above and below ground.

Increased demand on the telecommunications industry to meet the needs of internet subscribers has resulted in the need to transfer more and stronger electrical signals over greater distances. One way of accomplishing this is to amplify the signals using electronic circuit cards deployed in environmentally protected housings. To meet the need for transferring stronger electrical signals over greater distances, electronic circuit cards having higher amplification capabilities and thus greater heat dissipation rates are typically used. The need for stronger electrical signals may be accommodated by placing as many of these higher-heat-dissipating circuit cards into a single environmentally protected housing as possible.

SUMMARY

The present invention is related to an apparatus for enclosing electronic components such as used in telecommunication systems. The apparatus includes a housing defining a chamber, with the housing comprising a front wall having an outer surface and a length dimension greater than a width dimension. A pair of opposing side walls are each contiguous with the front wall, and a pair of opposing end walls are each contiguous with the side walls and the front wall. A plurality of non-removable heat transfer fins are an integral part of the outer surface of the front wall. The fins are positioned at an angle with respect to the length dimension of the front wall, with each of the fins having a continuous uninterrupted structure across the outer surface between the opposing side walls. A removable back cover opposite the front wall is configured to seal the chamber of the housing.

BRIEF DESCRIPTION OF THE DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

It should be understood that like reference characters denote like elements throughout the Figures.

DETAILED DESCRIPTION

In the following detailed description, embodiments are described in sufficient detail to enable those skilled in the art to practice the invention. It is to be understood that other embodiments may be utilized without departing from the scope of the present invention. The following description is, therefore, not to be taken in a limiting sense.

Figure 1A:
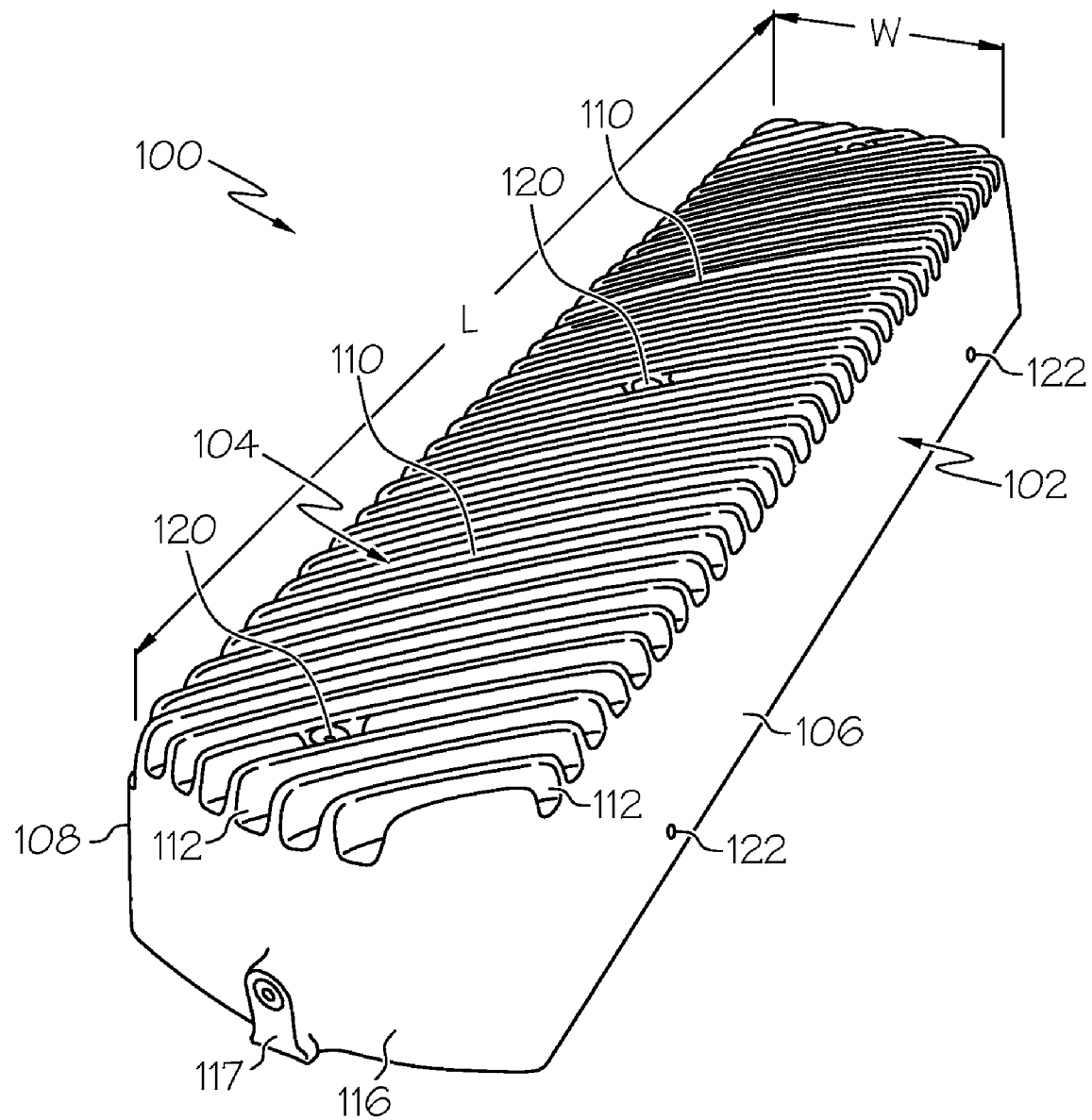
FIGS. 1A and 1B are top perspective views of a housing for an apparatus that encloses electronic components according to one embodiment.
Figure 1B:
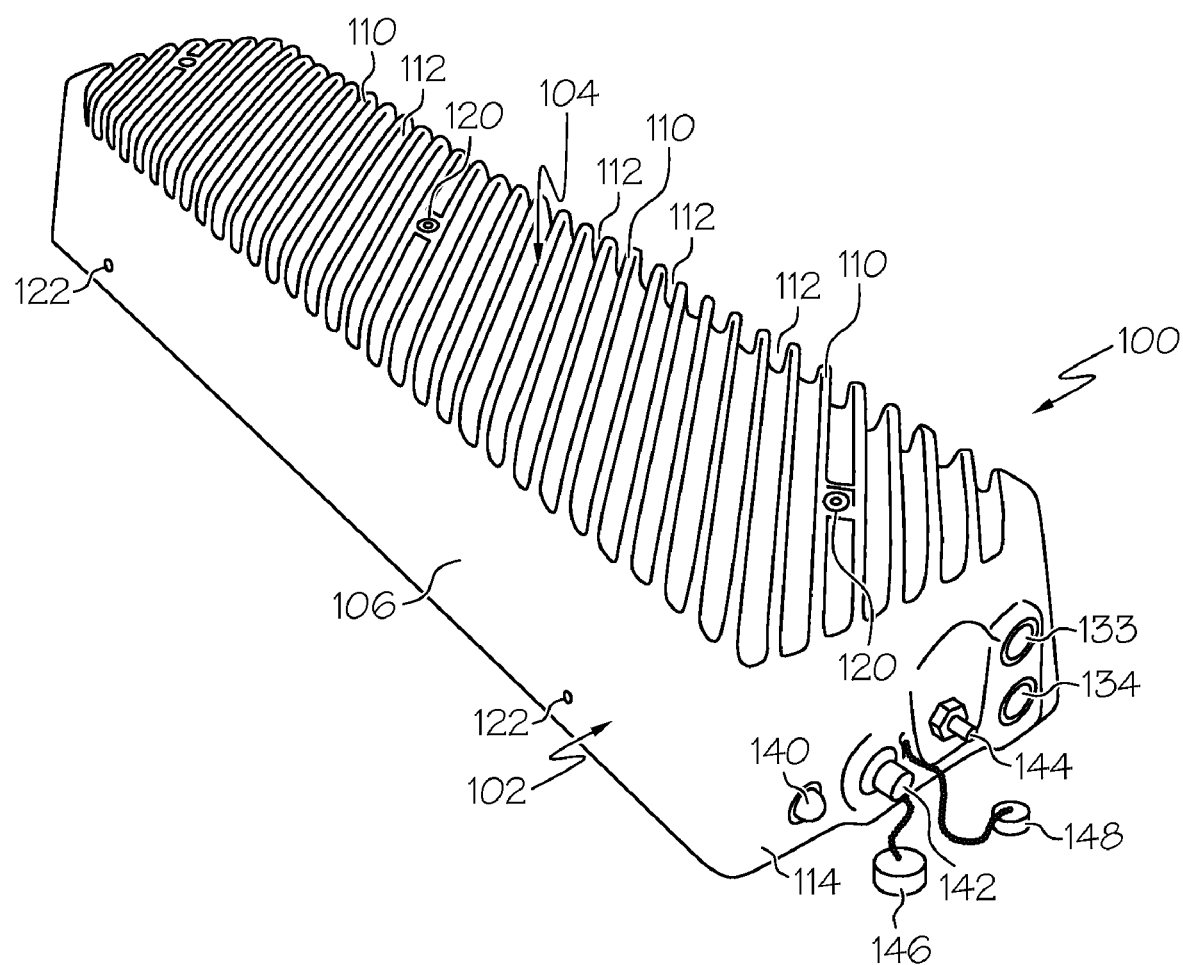

FIGS. 1A and 1B are top perspective views of one embodiment of a housing 100 for an apparatus that encloses electronic components used in a telecommunication system. The housing 100 includes a shell 102 having a front wall 104 with a length dimension L greater than a width dimension W. The front wall 104 is contiguous with two opposing side walls 106, 108 along the length dimension. The shell 102 also has opposing end walls 114, 116 that are each contiguous with side walls 106, 108 and front wall 104. As shown, housing 100 can have a unitary structure. A receiving mount 117 is located on end wall 116 of housing 100.

A plurality of non-removable heat transfer fins 110 defined by a plurality of adjacent channels 112 are located on an outer surface of front wall 104. The fins 110 are positioned at an angle with respect to the length dimension L of front wall 104. The fins can be angled from about 30-60 degrees, and in one embodiment, the fins are angled at about 45 degrees with respect to the length dimension L. The fins 110 can be formed as an integral part of the outer surface of front wall 104. Each of fins 110 has a continuous, uninterrupted structure with no gaps across the outer surface of front wall 104 between the top edges of opposing side walls 106, 108. This allows for smooth air flow through channels 112 adjacent to fins 110, providing for more efficient heat transfer from shell 102.

The shell 102 can be made of any material having a suitable combination of thermal properties, corrosion resistance, and strength. Suitable shell materials include, for example, aluminum, zinc, magnesium, titanium, steel, or combinations thereof. The shell 102 can be integrally formed by casting or machining the shell material.

A plurality of mounting locations 120, 122 with threaded apertures therein are provided on front wall 104 and on opposing side walls 106, 108 for mounting an optional solar shield, which is described further hereafter (see FIG. 7), on housing 100. As described in further detail hereafter, housing 100 can be mounted either vertically or horizontally with respect to the ground.

Figure 1C:
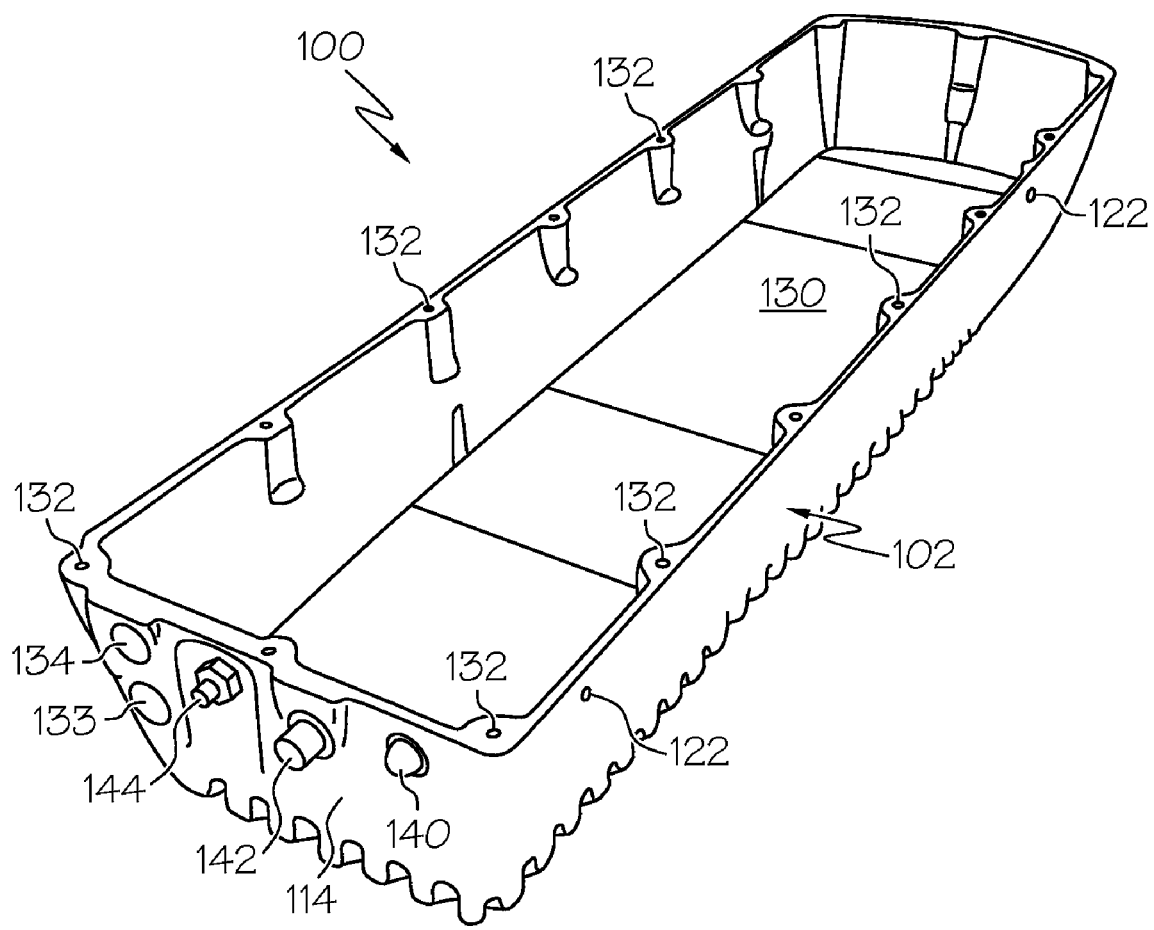
FIG. 1C is a bottom perspective view of the housing shown in FIGS. 1A and 1B.

FIG. 1C is a bottom perspective view of housing 100. As shown, shell 102 defines an internal chamber 130 that can hold various components of a telecommunication system, such as a wideband digital radio, a power amplifier, a radio frequency (RF) transport, a wideband digital transceiver, a power supply, or other components. The shell 102 is configured so that up to three different telecommunication services can be provided therefrom, such as, for example, 800-A, 800-B, specialized mobile radio (SMR), 1900, 900, and 2100. A plurality of mounting structures 132 are positioned in the interior of shell 102 around chamber 130 to provide for attachment of a back cover that is described hereafter.

Figure 2:
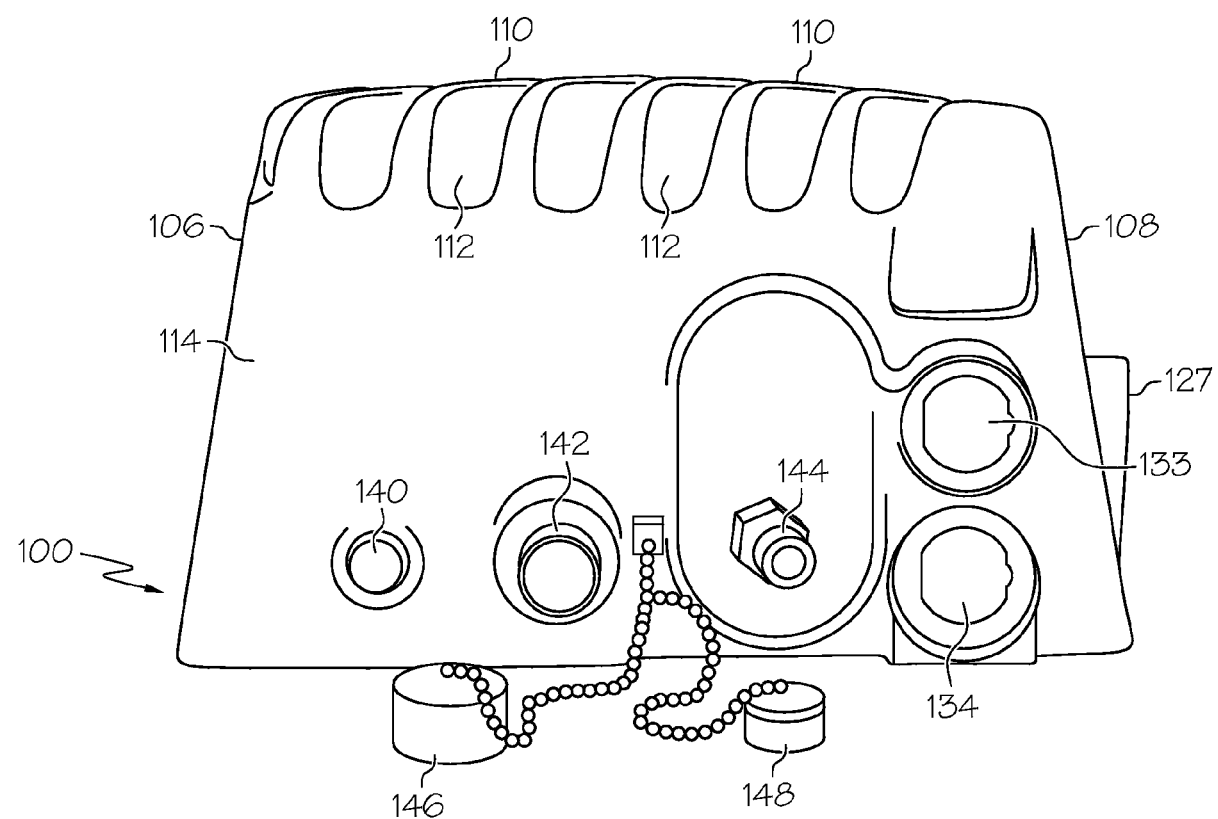
FIG. 2 is an end view of the housing as shown in FIG. 1B.

FIG. 2 is an end view of housing 100, which has a pair of receiving mounts 127 at each end of side wall 108. The receiving mounts 127 along with receiving mount 117 on end wall 116 are configured to engage with corresponding clamp members on the back cover to hold the back cover against housing 100 as described hereafter.

As depicted in FIGS. 1B, 1C, and FIG. 2, end wall 114 has a pair of sealed apertures 133, 134 for running cables into chamber 130 of shell 102. The end wall 114 can also include an LED indicator 140, and one or more lead-outs, such as lead-outs 142 and 144. The lead-outs can be used for wires that input and output electrical signals to and from telecommunication components held in chamber 130. For example, lead-out 142 can be used to supply power and lead-out 144 can be used to provide an RF signal. The lead-outs can be sealed against the weather and a pressure differential using any suitable material, such as an elastomeric material. One or more of the lead-outs can be provided with a cap attached to shell 102 to cover the lead-outs when not in use. For example, a cap 146 and a cap 148 shown in FIGS. 1B and 2 can be used to cover lead outs 142 and 144, respectively.

Figure 3:
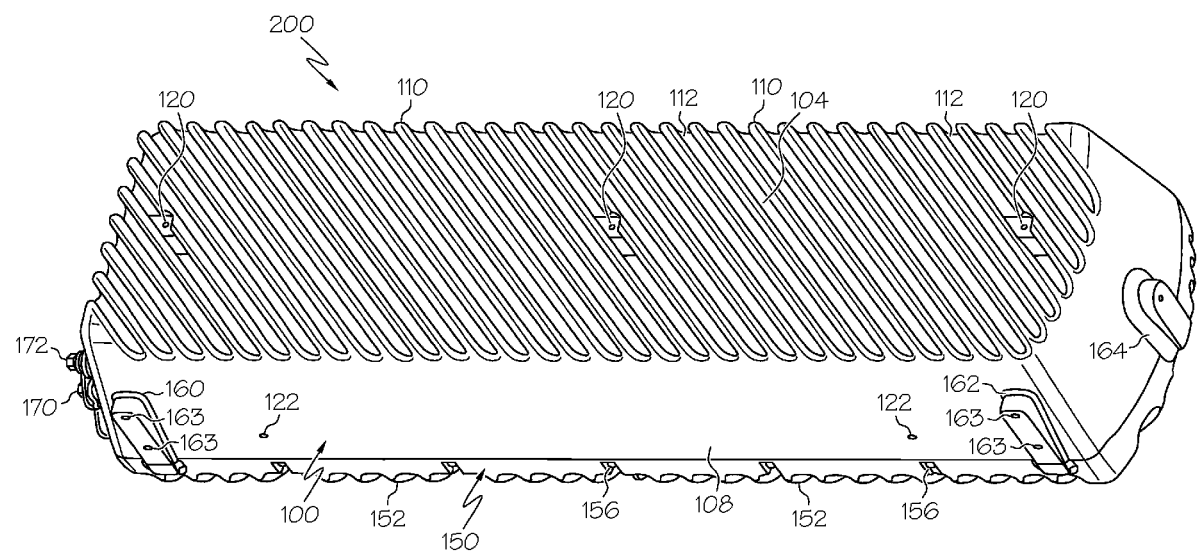
FIG. 3 is an elevated perspective view of an enclosure apparatus including the housing shown in FIGS. 1A-1C having a back cover attached thereto.
Figure 4A:
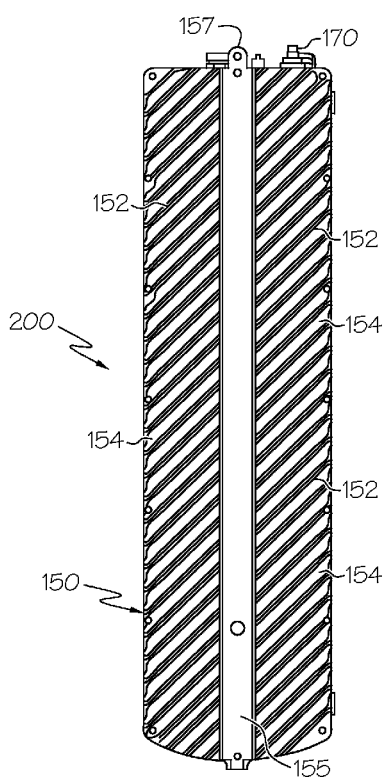
FIG. 4A is a back elevation view of the apparatus shown in FIG. 3.
Figure 4B:
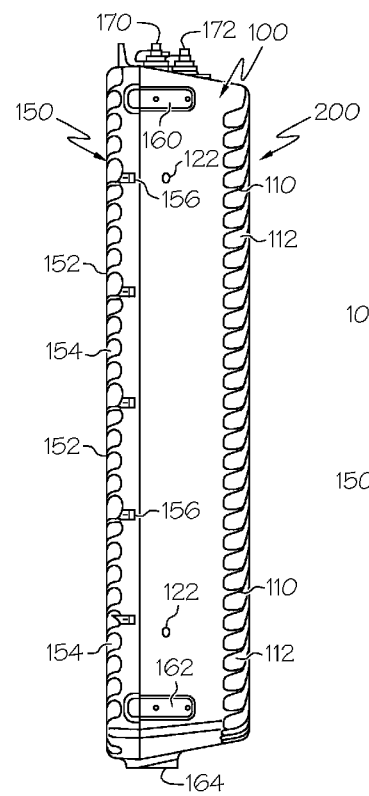
FIG. 4B is a side elevation view of the apparatus shown in FIG. 3.
Figure 4C:
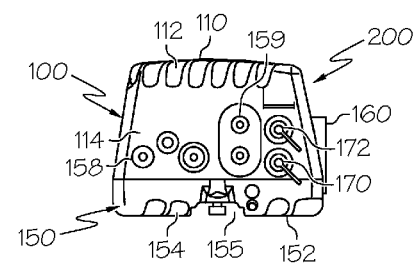
FIG. 4C is an end view of the apparatus shown in FIG. 3.

FIG. 3 is an elevated perspective view of an enclosure apparatus 200 including housing 100 having a back cover 150 attached thereto. FIGS. 4A-4C show other views of apparatus 200. The back cover 150 seals housing 100 against the weather and a pressure differential. The outer surface of back cover 150 can optionally have a plurality of angled heat transfer fins 152 that can be an integral part of the outer surface. The heat transfer fins 152 are defined by a plurality of adjacent channels 154, which is shown more clearly in FIG. 4A.

A back channel 155 extends through the middle of back cover 150 along the length thereof. The back channel 155 provides a gap between each fin 152 extending across the width of back cover 150. A mounting tab 157 with an aperture therethrough extends from back channel 155 for securing a mounting bracket, which is described further hereafter (see FIG. 6), to back cover 150.

The back cover 150 can provide selective sealing by using any suitable sealing means, such as compressing a gasket between housing 100 and back cover 150. Any suitable gasket can be used, such as an elastomeric O-ring, foam-in-place gasket, or the like. Compression of the gasket between housing 100 and back cover 150 can be accomplished using a plurality of fasteners 156, such as cap screws or a threaded-stud-and-nut arrangement that can engage mounting structures 132 (FIG. 1C). A plurality of clamp members 160, 162, and 164 on back cover 150 are engaged with respective receiving mounts (117, 127) on housing 100 to hold back cover 150 against housing 100. A pair of sealing caps 170, 172 can also be employed to cover apertures 133, 134 in end wall 114.

As shown in FIG. 4C, end wall 114 of housing 100 can be formed to have a different arrangement of lead-outs than shown in FIG. 2. For example, housing 100 can be fitted with a pressure relief valve 158 to guard against excessive external-to-internal pressure differences, and an additional lead-out 159 can be provided. Various other arrangements for lead-outs can also be formed in end wall 114 as desired depending on the intended use for apparatus 200.

Figure 5:
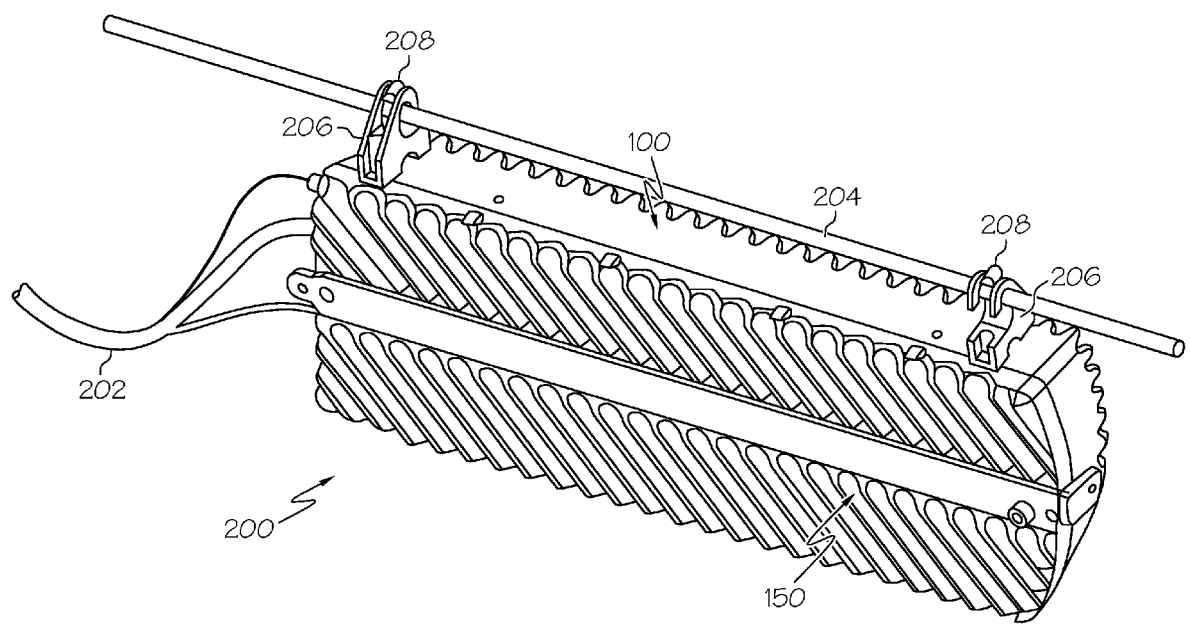
FIG. 5 is an elevated perspective view of the apparatus of FIG. 3 coupled to a cable.

The apparatus 200 can be secured in place at a location using various mechanisms. For example, apparatus 200 can be horizontally coupled to a cable via a pair of strand mount hooks. FIG. 5 is a perspective view of apparatus 200 having operational wires 202 extending therefrom, with apparatus 200 coupled to a cable 204 via a pair of strand mount hooks 206. A pair of cable clamps 208 can be used to further secure strand mount hooks 206 in place. The strand mount hooks 206 can be secured to housing 100 by use of clamp members 160, 162 (see FIG. 3) which each include threaded recesses 163 that are aligned with mounting apertures and bolts in strand mount hooks 206.

Further details regarding strand mount hooks and their use can be found in co-pending U.S. application Ser. No. 11/472,581, filed on Jun. 22, 2006, the disclosure of which is incorporated herein by reference.

Figure 6:
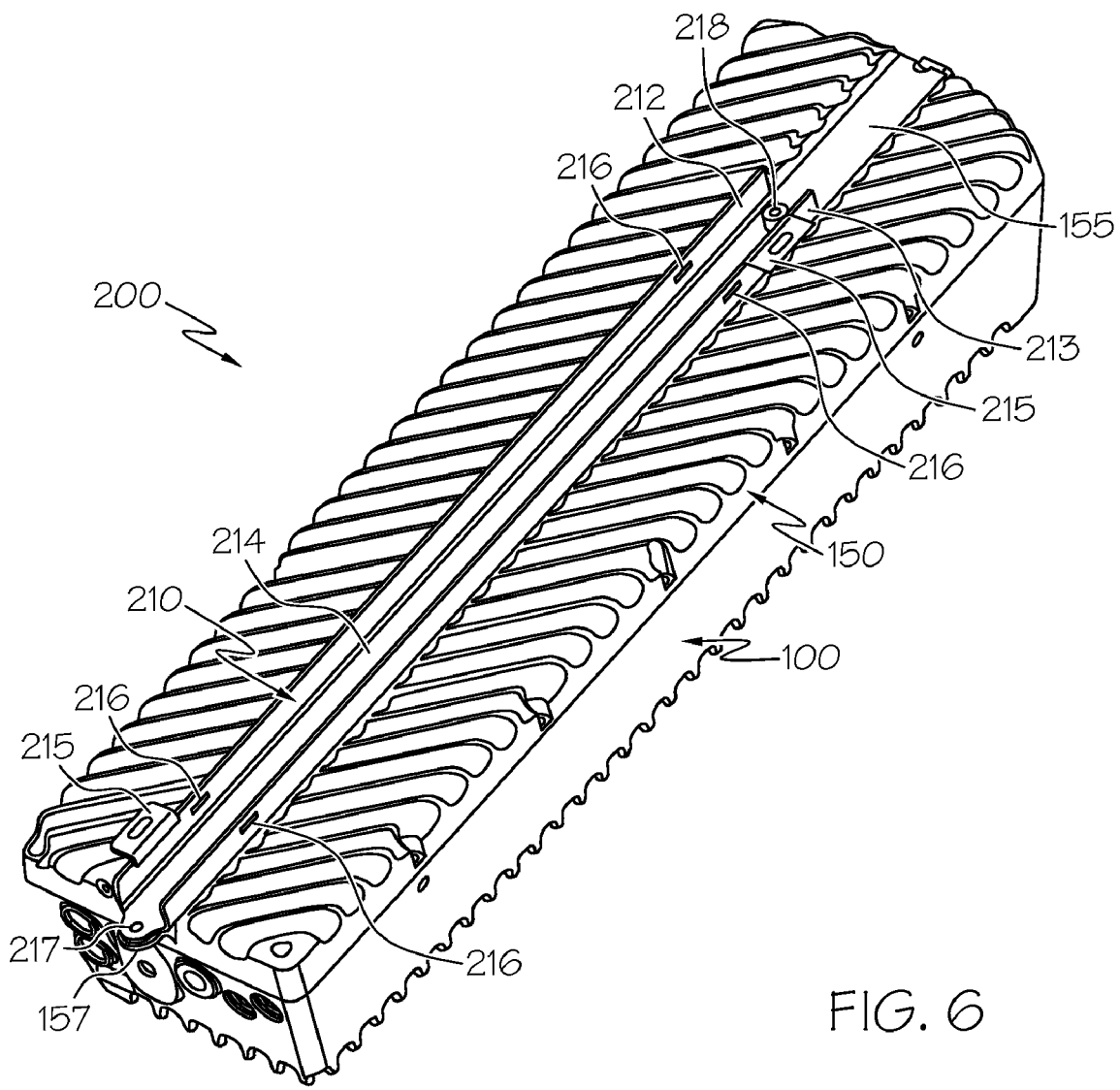
FIG. 6 is an elevated perspective view of the apparatus of FIG. 3 having a mounting bracket attached to the back cover.

In another embodiment, apparatus 200 can be mounted vertically in place to a pole such as a utility pole, or mounted to a wall. FIG. 6 is a perspective view of apparatus 200 having a mounting bracket 210 attached to back cover 150 for mounting apparatus 200 on a pole or wall (not shown). The mounting bracket 210 includes a pair of opposing rail members 212, 213 that are contiguous with a joint member 214. The rail members 212, 213 each have a mounting tab 215 with an aperture therethrough so that apparatus 200 can be mounted on a wall. The rail members 212, 213 also have opposing slits 216 for metal straps such as stainless steel straps that can be used to mount apparatus 200 to a pole. The joint member 214 has a mounting tab 217 with an aperture therethrough.

In order to mount apparatus 200, bracket 210 is either attached to a pole using metal straps, or bracket 210 is wall mounted using tabs 215 and lag screws. After mounting bracket 210 has been attached to the pole or wall, apparatus 200 is slid onto bracket 210, which engages back channel 155. The joint member 214 of bracket 210 has a slot that catches a shoulder screw 218 toward one end of back channel 155 when apparatus 200 is slid onto bracket 210. The bracket 210 is fastened at the other end using, for example, a screw and nut that engage mounting tab 217 of joint member 214 and mounting tab 157 on back cover 150 so that bracket 210 is secured to back channel 155.

Figure 7:
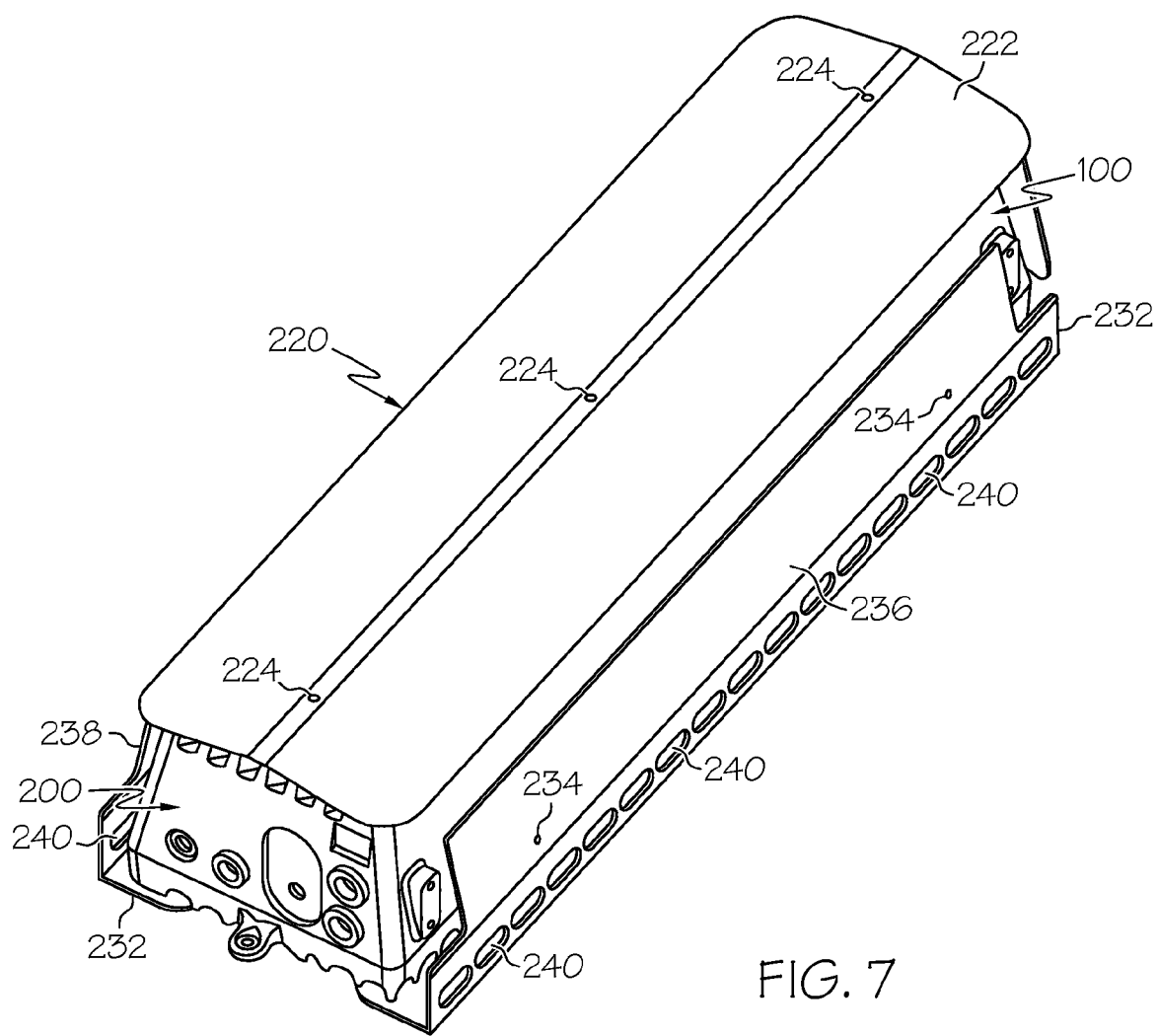
FIG. 7 is an elevated perspective view of the apparatus of FIG. 3 having a solar shield attached thereto.

FIG. 7 is a perspective view of another embodiment in which apparatus 200 has a solar shield 220 coupled thereto. A front shield portion 222 is attached to front wall 104 of housing 100 by aligning mounting apertures 224 in front shield portion 222 with corresponding mounting locations 120 in front wall 104 for bolting front shield portion 222 to front wall 104. A back shield portion 232 is attached to opposing side walls 106, 108 by aligning mounting apertures 234 in opposing side sections 236, 238 with corresponding mounting locations 122 in side walls 106, 108 for bolting back shield portion 232 to side walls 106, 108. The side sections 236, 238 of back shield portion 232 have a plurality of apertures 240 to provide for air venting and cooling.

The present enclosure apparatus is versatile since it is water proof, weather proof, submersible, and can be buried underground. Since the enclosure apparatus has no fans or other moving parts, extended reliability is provided.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. An apparatus for enclosing electronic components, comprising:

a housing defining a chamber, the housing comprising:
  a front wall having an outer surface and a length dimension greater than a width dimension;
  a pair of opposing side walls that are each contiguous with the front wall;
  a pair of opposing end walls that are each contiguous with the side walls and the front wall; and
  a plurality of non-removable heat transfer fins that are an integral part of the outer surface of the front wall, wherein the fins are positioned at an angle with respect to the length dimension of the front wall, with each of the fins having a continuous uninterrupted structure across the outer surface between the opposing side walls;
a removable back cover opposite the front wall and configured to seal the chamber of the housing; and
a mounting bracket attached to the back cover, the mounting bracket comprising:
  a pair of opposing rail members; and
  a joint member contiguous with the rail members;
  wherein the rail members have opposing slits for metal straps so that the apparatus is mountable on a pole.

2. The apparatus of claim 1, wherein the fins are angled from about 30 degrees to about 60 degrees with respect to the length dimension.

3. The apparatus of claim 1, wherein the fins are defined by a plurality of adjacent channels.

4. The apparatus of claim 1, further comprising a plurality of mounting locations on the front wall and the opposing side walls of the housing.

5. The apparatus of claim 1, wherein the housing is comprised of a metallic material.

6. The apparatus of claim 1, wherein the housing comprises aluminum, zinc, magnesium, titanium, steel, or combinations thereof.

7. The apparatus of claim 1, wherein the chamber is configured to contain one or more components of a telecommunication system.

8. The apparatus of claim 7, wherein the components comprise one or more of a wideband digital radio, a power amplifier, an RF transport, a wideband digital transceiver, a power supply, or combinations thereof.

9. The apparatus of claim 1, wherein one of the end walls has one or more sealed apertures for running cables into the chamber.

10. The apparatus of claim 1, wherein one of the end walls comprises one or more lead-outs for wires used to input and output electrical signals.

11. The apparatus of claim 10, further comprising one or more caps for the one or more lead-outs.

12. The apparatus of claim 1, wherein the back cover is configured to seal the chamber against weather and a pressure differential.

13. The apparatus of claim 1, farther comprising means for sealing the back cover to the housing.

14. The apparatus of claim 13, wherein the means for sealing the back cover to the housing comprises a gasket compressed between the back cover and the housing.

15. The apparatus of claim 14, wherein the gasket comprises an elastomeric O-ring or a foam-in-place gasket.

16. The apparatus of claim 1, wherein the back cover includes a plurality of angled heat transfer fins that are an integral part of an outer surface of the back cover.

17. The apparatus of claim 16, wherein the back cover includes a back channel extending along a length thereof.

18. The apparatus of claim 17, wherein the back channel provides a gap between each of the fins extending across a width of the back cover.

19. The apparatus of claim 1, further comprising a plurality of clamps on the back cover and a plurality of corresponding receiving mounts on the housing that are configured to hold the back cover against the housing.

20. The apparatus of claim 17, further comprising a mounting bracket engaged with the back channel of the back cover for mounting the back cover to a pole or wall.

21. The apparatus of claim 4, further comprising a solar shield attached to the mounting locations of the housing.

22. An apparatus for enclosing electronic components, comprising:
  a housing defining a chamber and having a unitary structure, the housing comprising:
    a front wall having an outer surface and a length dimension greater than a width dimension;
    a pair of opposing side walls that are each contiguous with the front wall;
    a pair of opposing end walls that are each contiguous with the side walls and the front wall; and
    a plurality of non-removable heat transfer fins that are an integral part of the outer surface of the front wall and are defined by a plurality of adjacent channels, wherein the fins are positioned at an angle with respect to the length dimension of the front wall, with each of the fins having a continuous uninterrupted structure across the outer surface between the opposing side walls;
  a removable back cover having an outer surface opposite the front wall and configured to seal the chamber of the housing, the back cover comprising a plurality of angled heat transfer fins that are an integral part of the outer surface of the back cover;
  a plurality of receiving mounts on the housing;
  a plurality of clamps on the back cover, the clamps configured to engage the receiving mounts to hold the back cover against the housing; and
  a mounting bracket attached to the back cover, the mounting bracket comprising:
    a pair of opposing rail members; and
    a joint member contiguous with the rail members;
    wherein the rail members have opposing slits for metal straps so that the apparatus is mountable on a pole.

23. The apparatus of claim 22, further comprising a pair of strand mount hooks for coupling the housing to a cable.

24. The apparatus of claim 23, further comprising a pair of cable clamps for securing the strand mount hooks in place.

25. The apparatus of claim 22, wherein the rail members each have a mounting tab with an aperture therethrough so that the apparatus is mountable on a wall.

26. The apparatus of claim 22, wherein the joint member has a mounting tab with an aperture therethrough for securing the mounting bracket to the back cover.

27. The apparatus of claim 22, farther comprising a solar shield attached to the housing, the solar shield comprising:
  a front shield portion attached to the front wall of the housing; and
  a back shield portion attached to the opposing side walls of the housing.

28. The apparatus of claim 27, wherein the back shield portion has a plurality of apertures to provide for air venting and cooling.

29. The apparatus of claim 22, wherein the housing is configured so that up to three different telecommunication services can be provided therefrom.

* * * * *